United States Patent [19]
Blaker et al.

[11] Patent Number: 5,748,650
[45] Date of Patent: May 5, 1998

[54] DIGITAL PROCESSOR WITH VITERBI PROCESS

[75] Inventors: David Mark Blaker, Emmaus; Gregory Stephen Ellard, Forest Park; Muhammad Shafiul Mobin, Whitehall, all of Pa.

[73] Assignee: Lucent Technologies, Inc., Murray Hill, N.J.

[21] Appl. No.: 743,925

[22] Filed: Nov. 5, 1996

Related U.S. Application Data

[63] Continuation of Ser. No. 153,391, Nov. 16, 1993, abandoned.

[51] Int. Cl.$^6$ .................................................. G06F 11/10
[52] U.S. Cl. .................... 371/43.1; 371/43.6; 371/43.7; 371/43.8; 375/341
[58] Field of Search ..................... 371/43, 43.1, 43.2, 371/43.3, 43.4, 43.6, 43.7, 43.8; 375/94, 340, 341

[56] References Cited

U.S. PATENT DOCUMENTS

| | | | |
|---|---|---|---|
| 5,220,570 | 6/1993 | Lou et al. | 371/43 |
| 5,331,664 | 7/1994 | Desperben et al. | 371/43 |
| 5,331,665 | 7/1994 | Busschaert et al. | 371/43 |
| 5,432,804 | 7/1995 | Diamondstein et al. | 371/43 |

Primary Examiner—Reba I. Elmore
Assistant Examiner—Thomas E. Brown

[57] ABSTRACT

A signal processor with an embedded Viterbi co-processor which works in parallel with the signal processor is disclosed.

12 Claims, 2 Drawing Sheets

DIGITAL PROCESSOR WITH VITERBI PROCESS

This application is a continuation of abandoned application under 37 CFR 1.62 of prior application Ser. No. 08/153,391 filed on Nov. 16, 1993 by David Mark Blaker, Gregory Stephen Ellard, and Mohammad Shafiul Mobin for Digital Processor With Viterbi Process.

CROSS REFERENCE TO RELATED APPLICATIONS

This application is related to the following concurrently filed, copending applications, each of which is incorporated herein by herein by reference:

Application Ser. No. 08/153,334, entitled "Efficient Utilization of Present State/Next State Registers," filed Nov. 16, 1993, by D. Blaker, M. Diamondstein, G. Ellard, M. Mobin, H. Sam and M. Thierbach, our docket number Blaker 3-2-3-3-4-10;

Application Ser. No. 08/152,531, entitled "Variable Length Tracebacks," filed Nov. 16, 1993, by D. Blaker, G. Ellard, and M. Mobin, our docket number Blaker 4-4-4;

Application Ser. No. 08/153,333, entitled "Power and Time Saving Initial Tracebacks," filed Nov. 16, 1993, by D. Blaker, G. Ellard, and M. Mobin, our docket number Blaker 6-6-6;

Application Ser. No. 08/152,805, entitled "Digital Receiver with Minimum Cost Index Register," filed Nov. 16, 1993, by D. Blaker, G. Ellard, M. Mobin and H. Sam, our docket number Blaker 2-2-2-3;

Application Ser. No. 08/153,405, entitled "Digital Processor and Viterbi Decoder Having Shared Memory," filed Nov. 16, 1993, by M. Diamondstein, H. Sam and M. Thierbach, our docket number Diamondstein 1-2-8; and Application Ser. No. 08/152,807, entitled "Digital Signal Processor," filed Nov. 16, 1993, by D. Blaker, G. Ellard, M. Mobin and M. Thierbach, our docket number Blaker 5-5-5-9.

TECHNICAL FIELD

This invention relates generally to digital signal processors, in general, and more particularly to digital signal processors implementing a Viterbi process.

BACKGROUND OF THE INVENTION

Mobile communication devices, such as mobile digital cellular telephones, often employ digital signal processors for processing and filtering received and transmitted digital signals. Often, a separate chip is provided to implement a Viterbi process for correcting errors in the incoming signals. Alternatively, a Viterbi process is encoded in software within the digital signal processor.

The Viterbi process is a maximum likelihood decoding process that provides forward error correction. The Viterbi process is used in decoding a sequence of encoded signals, such as a bit stream. The bit stream may represent encoded information in telecommunication system transmission through various media wish each set of bits representing a symbol instant. In the decoding process, the Viterbi processor works back through a sequence of possible bit sequences at each symbol instant to determine which one bit sequence is most likely to have been transmitted. The possible transitions from a bit state at one symbol instant to a bit at a next, subsequent, symbol instant is limited. Each possible transition from one state to a next state may be shown graphically and is defined as a branch. A sequence of interconnected branches is defined as a path. Each state can make a transition to a limited number of the next states upon receipt of the next bit in the bit stream. Some paths survive and other do not survive during the decoding process. By eliminating those transitions that are not permissible, computational efficiency can be achieved in determining the most likely paths to survive. The Viterbi process typically defines and calculates a branch metric associated with each branch and employs this branch metric to determine which paths survive and which paths do not survive.

Typically, the Viterbi process is implemented on a chip which is separate from the digital signal processing chip, (or, as mentioned before, it may be implemented in digital signal processor software). Received signals are first routed to the Viterbi processor for decoding while the digital signal processor is silent. The decoded signals are then routed to the digital signal processor for further processing.

As mobile communication devices proliferate, there remains a need for a faster, more efficient processing of received signals.

SUMMARY OF THE INVENTION

Efficient processing of signals is accomplished by the present invention which illustratively includes:

a digital processor for performing a signal processing function and an embedded co-processor which implements a Viterbi decoding function, while the digital processor is concurrently performing a signal processing function.

DETAILED DESCRIPTION

Figure 1:
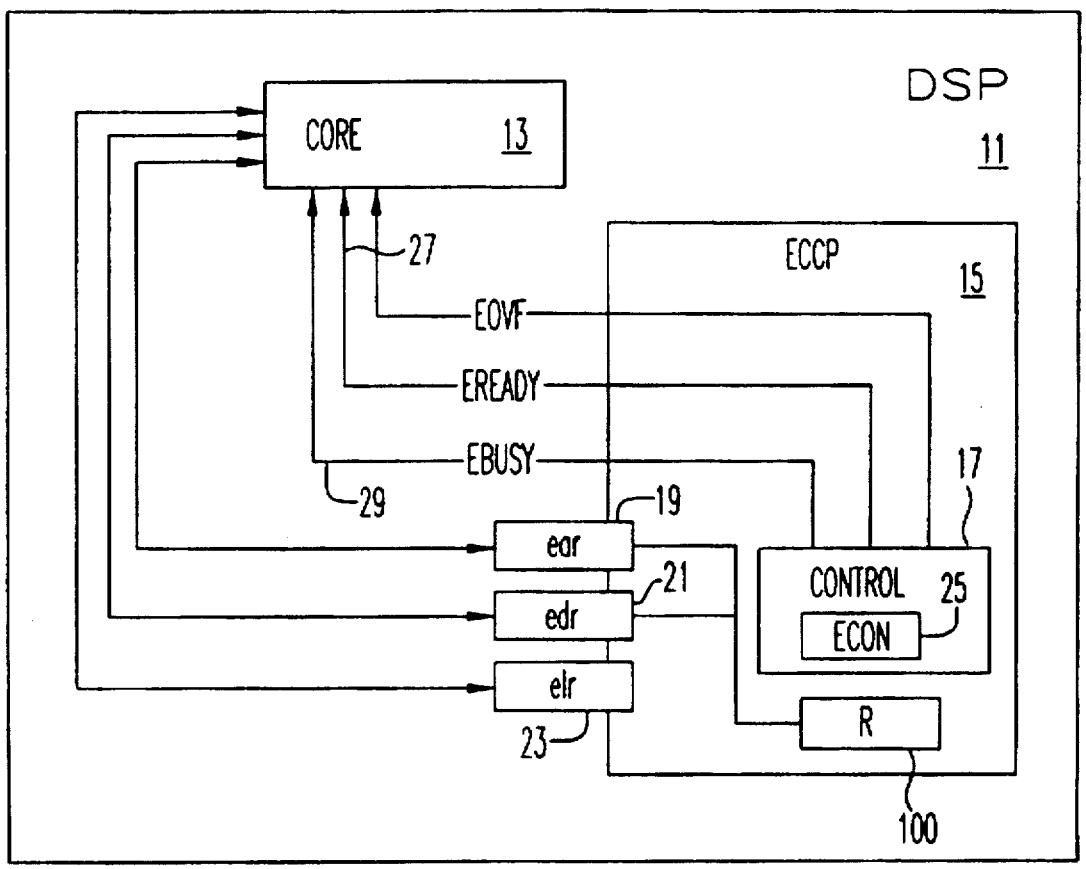
FIG. 1 is a block diagram showing an illustrative embodiment of the present invention.

A digital signal processor (DSP) is represented by reference numeral 11. Master control of the digital signal processor is provided by control unit 13. Error correction co-processor (ECCP) 15 is embedded within digital signal processor 11. ECCP 15 operates under the direction of its own internal control unit 17. A single instruction from DSP control unit 13 causes control unit 17 to direct ECCP 15 to perform a complete Viterbi decoding operation. Since the Viterbi process is embedded within ECCP control 17, a significant DSP code compression is achieved.

The DSP control 13 communicates with ECCP 15 via three interface registers. An address register, ear, 19 is employed to indirectly address the ECCP internal memory mapped registers. A data register, edr 21, works in concert with the address register, 19, to indirectly read from or write to an ECCP internal memory mapped register. After each access, the contents of the address register, 19, are incremented by one. Instructions to the ECCP 15 are provided via instruction register, eir, 23. When the proper code is provided to instruction register, 23, ECCP 15 will perform either: i) an MLSE (maximum likelihood sequence estimation), or ii) a convolutional decoding, or iii) a simple traceback operation. It is known to those of ordinary skill in the art, that the Viterbi process may be utilized to provide both MLSE or convolutional decoding.

Registers 100 are provided within ECCP 15. Registers 100 store: complex channel estimates, generating polynomials, complex received signals, input signals for convolutional decoding and decoded symbols. Each of these registers as accessed by writing an address in ear register 19 and reading or writing register edr 21. Instruction which directs the ECCP 15 to function is written into eir register 23.

Should MLSE operation be desired, control register, ECON, 25 within control unit 17 receives via registers 19 and 21 the number of taps required for MLSE operation. Should, however, an instruction for convolutional coding be provided via register 23, control register 25 may be configured for various constraint lengths, 2 through 7, and code rates, 1/1 through 1/6.

ECCP 15 operates generally independently of the rest of DSP 11 and in parallel therewith. Thus, for example, at the beginning of a processing sequence, ECCP 15 may be inactive. Meanwhile, the balance of DSP 11 receive or transmits signals or performs other operations. The balance of DSP 11, programs the operational modes of the ECCP 15.

Next, DSP core processor 13 instructs ECCP 15 to commence a Viterbi process while the remainder of DSP 11 continues with other work such as receiving or transmitting new signals from a voice band or base band codec, performing a speech processing algorithm, performing channel adaptation, encryption/decryption or interleaving/de-interleaving. Meanwhile, ECCP 15 is instructed by core processor 13 to perform either an MLSE process or a convolutional decoding operation. When ECCP 15 is busy performing a Viterbi process, the signal EBUSY, 29, is provided to core processor unit 13.

When ECCP 15 has finished performing its operation, it provides a signal, EREADY, 27 to control unit 13. Signal, EREADY, indicates to core processor 13 that the information provided to ECCP 15 has been subjected to a Viterbi process for MLSE or convolutional decoding. In some circumstances, it is desirable to perform first MLSE and then convolutional decoding upon a received signal. Thus, an incident bit stream would be provided to ECCP 15 for MLSE. After MLSE is completed, and EREADY signal 27 is provided to control unit. The MLSE processed signals are then decrypted and de-interleaved and re-ordered by the balance of DSP 11 and fed again into ECCP 15 together with an instruction via register 23 that the MLSE processed signals be subjected to a Viterbi process for convolutional decoding.

In other circumstances, MLSE may not be required and only convolutional decoding may be performed. Anyway, after the ECCP has finished, it provides the EREADY signal and the Viterbi decoded bit stream is available to the balance of DSP 11 for further processing. Such further processing may include speech decompression or data presentation in an appropriate format. This parallelism of operation between the ECCP and the balance of DSP 11 provides a very timely and efficient processing of received signals hitherto not accomplished in the art.

The output of the Viterbi operation can be either a hard output or a soft output. A hard output represents a binary decision (true/false, or 0–1 or +1, −1). A soft output is a hard output associated with a confidence measure. Core 13 directs ECCP 15 whether to provide hard or soft output. Various types of soft decision outputs known to those skilled in the art may be provided.

Figure 2:
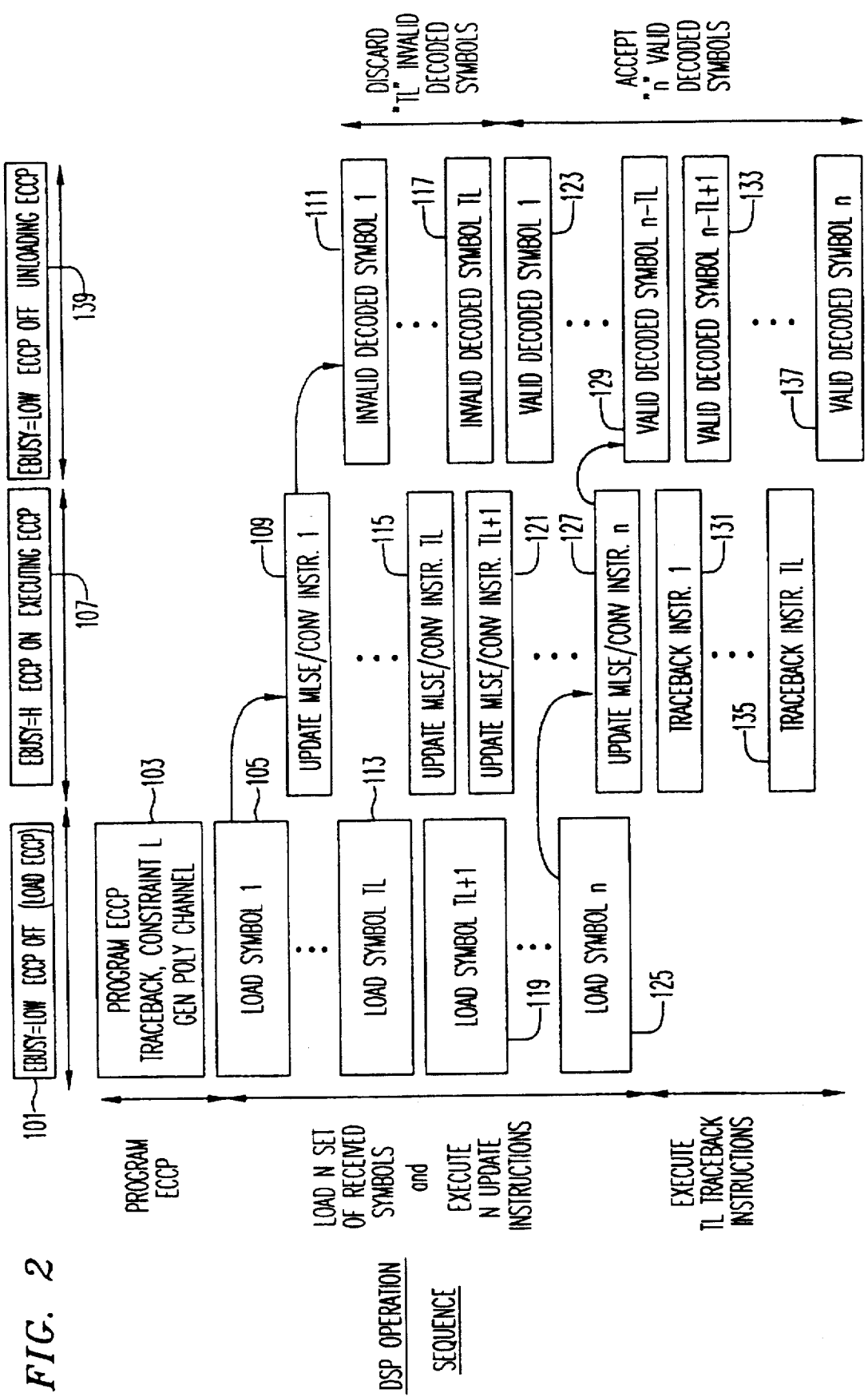
FIG. 2 is a block diagram illustrative of a process according to the present invention.

FIG. 2 is a block diagram which illustrates in somewhat more detail the parallelism of operation between ECCP 15 and the balance of DSP 11. At the beginning of a decoding operation, as indicated by block 101, the EBUSY signal is false. ECCP 15 is turned off, and ready to be loaded. Block 103 indicates that ECCP 15 is programmed via register 23 by control unit 13. Among the information provided to ECCP 15 are the Viterbi traceback and constraint lengths, and generating polynomial. Should a MLSE operation be desired, the number of channel taps is also provided.

Next, the input signal is loaded into the ECCP, as designated by block 105. When ECCP 15 receives the first update instruction, as shown in block 103, the value of the EBUSY flag is high, the ECCP is turned on and commencing a complete Viterbi process. As designated by block 109, ECCP 15 performs an update calculation according to the MLSE or convolutional instruction which has been provided. Updating is an operation which, in general, involves calculating a branch metric for each possible branch, adding the branch metric to the accumulated cost associated with the state at the originating end of the branch, comparing the accumulated costs for each possible branch terminating at a state, and selecting the minimum accumulated cost associated with the terminating end of a branch. Then a symbol is decoded which corresponds the path memory (in the maximum likelihood sense).

Next, as indicated by block 111, the first symbol is decoded. However, because insufficient symbols have been received to perform a proper traceback, the first decoded symbol is invalid and therefore discarded. Next, as indicated by blocks 113, 115 and 117, a quantity of input symbols equal to the traceback length has been sequentially loaded into the DSP, the MLSE or convolutional instruction has been updated, and (again because the number of loaded symbols is still insufficient) a number of invalid decoded symbols equal in number to the traceback length, TL, have been obtained. (Of course a valid symbol decoding is possible, if required. For certain channel adaptation algorithms by using a smaller traceback length, TL. Theoretically, the best decoded symbol is obtained if the traceback length, TL, is longer.) If the traceback length is denoted by the symbol TL, the first TL signals are, of course, invalid and are discarded.

Blocks 119, 121 and 123 detail the valid decoding of the first symbol after symbol number TL+1 has been loaded, the MLSE/convolutional updating has been performed, and the first valid symbol has been decoded. Next, the remaining input symbols, up to symbol number n, are loaded and, as indicated by blocks 125, 127 and 129, and a quality equal to n-TL valid decoded symbols are obtained. (The number n is the total number of input symbols) At this point in the process, all of the input signals have been provided to the ECCP. Complete tracebacks which provide n-valid decoded symbols may be performed as indicated by blocks 131, 133, 135 and 137. Following each traceback instruction, one valid decoded symbol is obtained. The traceback instruction is executed TL times to obtain all the decoded symbols that were trapped in the traceback memory.

After n-valid decoded symbols are obtained, as indicated by block 137, the EBUSY flag becomes low, the ECCP turns off, and all of the valid decoded symbols are transferred to the balance of the digital signal processor for further processing.

We claim:

1. An integrated circuit comprising:
    a digital processor for performing a signal processing function;
    an embedded co-processor implementing a complete Viterbi decoding function, said co-processor performing said Viterbi decoding function while said digital processor is concurrently performing the signal processing function;

an address register for addressing at least one of a plurality of internal memory mapped registers of said co-processor; and a data register cooperating with the address register to read from and write to the at least one of the plurality of internal memory mapped registers;

wherein said co-processor operates under the control of said digital processor, commences operation upon receipt of a command from said digital processor and provides a signal to said digital processor when said co-processor is finished.

2. The device of claim 1 wherein said co-processor is programmed by said digital processor to perform either a maximum likelihood sequence estimation or a convolutional decoding.

3. The device of claim 1 wherein said digital processor provides a single instruction to said co-processor, said single instruction causing said co-processor to:

perform appropriate branch metric calculations for all possible state transitions to all states;

perform all corresponding add-compare-select operations of the Viterbi algorithm;

perform a complete traceback decoding process; and produces decoded symbols at the end of the traceback operation.

4. The device of claim 1 wherein said digital processor provides a code rate to said co-processor.

5. The device of claim 1 wherein said digital processor provides a branch metric calculation type to said co-processor.

6. The device of claim 1 wherein said digital processor instructs said co-processor whether to provide a soft or a hard decision output.

7. The device of claim 1 wherein said digital processor provides a constraint length to said coprocessor.

8. An integrated circuit comprising:

a digital processor for performing a signal processing function; and an embedded co-processor implementing a complete Viterbi decoding function, said co-processor performing said Viterbi decoding function while said digital processor is concurrently performing the signal processing function;

wherein said co-processor operates under the control of said digital processor, commences operation upon receipt of a command from said digital processor and provides a signal to said digital processor when said co-processor is finished, said co-processor is programmed by said digital processor to perform either a maximum likelihood sequence estimation or a convolutional decoding, said digital processor provides a number of channel taps to said co-processor when the maximum likelihood sequence estimation is performed.

9. An integrated circuit comprising:

a digital processor for performing a signal processing function; and an embedded co-processor implementing a complete Viterbi decoding function, said co-processor performing said Viterbi decoding function while said digital processor is concurrently performing the signal processing function;

wherein said co-processor operates under the control of said digital processor, commences operation upon receipt of a command from said digital processor and provides a signal to said digital processor when said co-processor is finished, said co-processor is programmed by said digital processor to perform either a maximum likelihood sequence estimation or a convolutional decoding, said digital processor provides a Viterbi traceback length, a constraint length and a generating polynomial to said co-processor when the convolutional decoding is performed.

10. An integrated circuit comprising:

a digital processor for performing a signal processing function; and an embedded co-processor implementing a complete Viterbi decoding function, said co-processor performing said Viterbi decoding function while said digital processor is concurrently performing the signal processing function;

wherein said co-processor operates under the control of said digital processor, commences operation upon receipt of a command from said digital processor and provides a signal to said digital processor when said co-processor is finished, said digital processor instructs said co-processor to perform the maximum likelihood signal estimation upon a first bit stream to produce a second bit stream and then to perform the convolutional decoding upon said second bit stream to produce a third bit stream.

11. An integrated circuit comprising:

a digital processor for performing a signal processing function; and an embedded co-processor implementing a complete Viterbi decoding function, said co-processor performing said Viterbi decoding function while said digital processor is concurrently performing the signal processing function;

wherein:

a) said digital processor programs said co-processor;

b) said digital processor loads a first symbol into said co-processor;

c) said co-processor performs a Viterbi update operation upon said symbol to obtain a decoded symbol;

d) steps b) and c) are repeated TL−1 times while said digital processor performs other signal processing functions;

e) said digital processor loads a TL+1 symbol into said co-processor;

f) said co-processor performs a Viterbi traceback operation upon said TL+1 symbol to obtain a valid decoding symbol; and g) said digital processor loads an $n^{th}$ symbol and said co-processor performs a Viterbi traceback operation having traceback length TL utilizing n symbols to obtain n valid decoded symbols.

12. The device of claim 11 wherein, while said co-processor performs said Viterbi process, said digital processor performs at least one function of a group of functions comprising: channel adaptation, encryption, decryption, interleaving speech processing de-interleaving speech processing and input/output operations.

* * * * *